(12) United States Patent
Shen

(10) Patent No.: US 7,973,399 B2
(45) Date of Patent: Jul. 5, 2011

(54) EMBEDDED CHIP PACKAGE

(75) Inventor: Li-Cheng Shen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 348 days.

(21) Appl. No.: 11/849,371

(22) Filed: Sep. 4, 2007

(65) Prior Publication Data
US 2008/0099903 A1 May 1, 2008

(30) Foreign Application Priority Data

Oct. 31, 2006 (TW) .............................. 95140130 A

(51) Int. Cl.
*H01L 23/06* (2006.01)
(52) U.S. Cl. ................. 257/684; 257/700; 257/E23.178
(58) Field of Classification Search .................. 361/792;
257/686, E21.499, E23.001, 723, 684, 700,
257/E23.169, E23.172, E23.173, E23.174,
257/E23.178
See application file for complete search history.

(56) References Cited

U.S. PATENT DOCUMENTS

| | | | | |
|---|---|---|---|---|
| 5,241,456 | A * | 8/1993 | Marcinkiewicz et al. | 361/792 |
| 5,280,192 | A * | 1/1994 | Kryzaniwsky | 257/723 |
| 6,469,374 | B1 * | 10/2002 | Imoto | 257/686 |
| 6,759,270 | B2 | 7/2004 | Infantolino et al. | |
| 6,784,530 | B2 * | 8/2004 | Sugaya et al. | 257/686 |
| 7,091,593 | B2 * | 8/2006 | Ishimaru et al. | 257/686 |

FOREIGN PATENT DOCUMENTS

TW        I237883         8/2005

OTHER PUBLICATIONS

Article titled "Redistributed Chip Package (RCP) Technology" authored by Freescale Semiconductor. inc. 2005.
"Office Action of counterpart Taiwan Application", issued on Jan. 15, 2010, p. 1-p. 4.

* cited by examiner

*Primary Examiner* — Matthew E Warren
*Assistant Examiner* — Fang-Xing Jiang
(74) *Attorney, Agent, or Firm* — Jianq Chyun IP Office

(57) ABSTRACT

An embedded chip package includes a substrate, a semiconductor structure, an encapsulating material layer and a plurality of conductive vias. Herein the substrate includes at least a dielectric layer and at least a patterned circuit layer disposed on the dielectric layer. The semiconductor structure is disposed on the substrate and has a plurality of electrical bonding pads, and the electrical bonding pads contact the dielectric layer. The encapsulating material layer is disposed on the substrate and around the semiconductor structure. In addition, a plurality of conductive vias is disposed in the substrate to electrically connect the patterned circuit layer to the electrical bonding pads.

7 Claims, 16 Drawing Sheets

(a)

(b)

(a)

(b)

(a)

(b)

EMBEDDED CHIP PACKAGE

CROSS-REFERENCE TO RELATED APPLICATION

This application claims the priority benefit of Taiwan application serial no. 95140130, filed Oct. 31, 2006. All disclosure of the Taiwan application is incorporated herein by reference.

BACKGROUND OF THE INVENTION

1. Field of the Invention

The present invention generally relates to a chip package and the fabricating method thereof, and more particularly, to a stacked chip package, an embedded chip package and a fabricating method thereof.

2. Description of Related Art

In the semiconductor industry, a chip packaging process is intended to avoid a bare chip from being affected by moisture, heat and noise and provide the bare chip with an electrical connection medium between the chip and the external circuit. In recent years, along with the update in tremendous pace for the electronic technology and the continuous integrations and renovations of the high-tech electronic products, the conventional semiconductor packaging technology is incapable of meeting the requirements of the product functions and cost. Currently, the semiconductor packaging technology has been advancing towards integrating a chip into a circuit substrate, so as to largely downsize the area/volume of a whole package and to meet the design requirements of an electronic product, such as, having light, thin and smallish figure and characterizing high performance, high speed and high density.

The major process flow for a conventional embedded chip package is to load a chip on a substrate and then a dielectric material is used to embed the chip in the package. Usually, the dielectric material is formed on a chip by a spin spreading, printing or lamination process. However, the above-mentioned process methods are likely to make the surface of the dielectric material uneven to adversely affect the successive processes. In particular, for a thicker chip, the thickness difference caused by the above-mentioned process methods would result in a poor surface evenness thereof and affect the production yield. In order to solve the unevenness problem, it is very often to use a lapping process for thinning the chip or use more dielectric material to reduce the chip surface unevenness, and then the chip may be embedded, wherein the lapping processes may increase the fabrication cost and also may damage the chip during the chip embedded processes. Thus, the fabrication cost may be further increased.

Many different schemes of the embedded chip packaging technology have been proposed. For example, Freescale Semiconductor, Inc. proposed a semiconductor packaging scheme related to an embedded chip package. Besides, in U.S. Pat. No. 6,759,270, entitled "Semiconductor Chip Module and Method of Manufacture of Same", proposes fabricating a cavity in a substrate for embedding a chip first. Next, the chip is placed in the cavity and then dielectric material spread over the chip. Next, metal circuits and solder bonding pads are formed to complete an embedded chip package. The disadvantage of the above scheme is that an additional filler is needed to fill the gaps between the chip and the substrate, the package thickness is mainly occupied by the thick substrate and the cavity depth is hard to control.

In another U.S. Pat. No. 6,469,374, entitled as "Superposed Printed Substrates and Insulating Substrates Having Semiconductor Elements Inside", it disclosed an embedded chip packaging process including forming a cavity for embedding a chip by superposing a plurality of hollow substrates. The disadvantage of this scheme is almost the same as the above described scheme where the package thickness is mainly occupied by the thick substrate, an additional filler is needed to fill the gaps between the chip and the substrate. Thus, it is difficult to align the substrates.

Accordingly, how to embed a chip in a circuit substrate without encountering the problems described above is an important issue for the semiconductor manufacturers.

SUMMARY OF THE INVENTION

The present invention provides a stacked chip package, an embedded chip package and fabricating method thereof, wherein various problems occurring in the conventional packaging schemes may be reduced. The fabrication method is compatible with the present semiconductor process. Thus, the process fabricating the embedded chip package can be simplified and the fabrication cost can be effectively reduced.

The present invention provides an embedded chip package, which includes a substrate, a semiconductor structure, an encapsulating material layer and a plurality of conductive vias, wherein the substrate includes at least a dielectric layer and at least a patterned circuit layer disposed on the dielectric layer. The semiconductor structure is disposed on the substrate and has a plurality of first electrical bonding pads contacting the dielectric layer. The encapsulating material layer is disposed on the substrate and around the semiconductor structure. In addition, the above-mentioned conductive vias are disposed in the substrate to electrically connect the patterned circuit layer to the first electrical bonding pads.

The encapsulating material includes, for example, molding compound or potting/casting compound. The semiconductor structure may be a semiconductor chip having the first electrical bonding pads. In addition, the semiconductor structure can also comprise a semiconductor chip and a cover layer which can be a thermally or electrically conductive layer, e.g., a metal layer, wherein a plurality of first electrical bonding pads is located on the semiconductor chip. The semiconductor structure can further comprise a first semiconductor chip, a bonding layer and a second semiconductor chip, wherein a plurality of first electrical bonding pads is disposed on the first semiconductor chip, the bonding layer is disposed on the first semiconductor chip and can be an adhesive layer or a metal layer. The second semiconductor chip is disposed on the bonding layer, a plurality of second electrical bonding pads is disposed on the upper surface of the second semiconductor chip and the lower surface thereof contacts the bonding layer.

The present invention further provides an embedded chip package, which includes a first substrate, a semiconductor structure, an encapsulating material layer, a plurality of first conductive vias, a second substrate and a plurality of second conductive vias, wherein the first substrate includes at least a first dielectric layer and at least a first patterned circuit layer disposed on the first dielectric layer. The semiconductor structure is disposed on the first substrate and a plurality of first electrical bonding pads is disposed on the semiconductor structure and contacts the first dielectric layer. The encapsulating material layer is disposed on the first substrate and the entire semiconductor structure. The first conductive vias are disposed in the first substrate to electrically connect the first patterned circuit layer to the first electrical bonding pads. The second substrate includes at least a second dielectric layer and a second patterned circuit layer disposed on the second dielectric layer and is disposed on the semiconductor structure and the encapsulating material layer, while the second dielectric layer contacts the semiconductor structure. The second conductive vias are disposed in the first substrate, the encapsulating material layer and the second substrate to electrically connect the first patterned circuit layer to the second patterned circuit layer.

The material of the encapsulating material layer includes, for example, molding compound or potting/casting compound. The encapsulating material layer may also be disposed on the semiconductor structure. The above-mentioned semiconductor structure is a semiconductor chip having a plurality of first electrical bonding pads. The semiconductor structure can also comprise a semiconductor chip and a cover layer which can be a thermally or electrically conductive layer, e.g., a metal layer, wherein the first electrical bonding pads are located on the semiconductor chip. Besides, the semiconductor structure may further comprise a first semiconductor chip, a between-chip bonding layer and a second semiconductor chip, wherein the first electrical bonding pads are disposed on the first semiconductor chip, the bonding layer is disposed between the first and the second chips and can be an adhesive, thermally conductive or electrically conductive layer, e.g., an adhesion film/paste or a metal layer. The second semiconductor chip is disposed on the bonding layer, a plurality of second electrical bonding pads is disposed on the upper surface of the second semiconductor chip and the lower surface of the second semiconductor chip is bonded to the bonding layer.

According to the embodiment of the present invention, the embedded chip package further includes a plurality of third conductive vias to electrically connect the second patterned circuit layer to the second electrical bonding pads.

The present invention further provides a stacked chip package, which includes a carrier component and at least a chip package, wherein the carrier component is one of the above-mentioned embedded chip packages, the chip package is disposed on the carrier component and is electrically connected to the carrier component The chip package can be one of the above-mentioned embedded chip package or any other available types of chip packaging. The carrier component can be electrically connected to the chip package by using by wire bonding, solder bumps, conductive particles, mechanical contact, metal bonding, or et.

The present invention further provides a method for fabricating an embedded chip package. The method includes forming a semiconductor structure on a carrier plate, wherein a plurality of first electrical bonding pads has been formed on the semiconductor structure and the first electrical bonding pads contact the carrier plate. Next, an encapsulating material layer is formed on the carrier plate and the entire semiconductor structure. Thereafter, the carrier plate is removed and a first substrate is formed on the encapsulating material layer and the semiconductor structure, wherein the first substrate includes at least a first dielectric layer and at least a first patterned circuit layer formed on the first dielectric layer, and the first dielectric layer contacts the semiconductor structure. Furthermore, a plurality of first conductive vias is formed in the first substrate to electrically connect the first patterned circuit layer to the first electrical bonding pads.

The step of forming an encapsulating material layer on the carrier plate and the entire semiconductor structure includes, for example, press molding, potting or injection molding process. The material of the encapsulating material layer includes, for example, molding compound or potting/casting compound. The semiconductor structure may be a semiconductor chip having a plurality of first electrical bonding pads. The semiconductor structure may also comprise a semiconductor chip and a cover layer which can be a thermally/ electrically conductive layer, e.g., a metal layer, while a plurality of first electrical bonding pads is located on the semiconductor chip. The semiconductor structure may further comprise a first semiconductor chip, a between-chip bonding layer and a second semiconductor chip, wherein the first electrical bonding pads are disposed on the first semiconductor chip, the bonding layer is disposed between the first and the second chips and can be an adhesive, thermally conductive or electrically conductive layer, e.g., an adhesion film/paste or a metal layer. The second semiconductor chip is formed on the bonding layer, a plurality of second electrical bonding pads is formed on the upper surface of the second semiconductor chip and the lower surface of the second semiconductor chip is bonded to the bonding layer.

Before forming the first conductive vias in the first substrate, a second substrate may be formed on the encapsulating material layer and the semiconductor structure, wherein the second substrate includes at least a second dielectric layer and at least a patterned circuit layer formed on the second dielectric layer, and the second dielectric layer contacts the semiconductor structure. A plurality of second conductive vias may be formed in the first substrate, the second substrate and the encapsulating material layer, so as to electrically connect the first patterned circuit layer to the second patterned circuit layer. The encapsulating material layer can also be formed between the semiconductor chip and the second substrate. The semiconductor structure may be a semiconductor chip having a plurality of first electrical bonding pads. The semiconductor structure may also comprise a semiconductor chip and a metal layer, wherein the first electrical bonding pads are located on the semiconductor chip. The semiconductor structure may further include a first semiconductor chip, a between-chip bonding layer and a second semiconductor chip, wherein a plurality of first electrical bonding pads is formed on the first semiconductor chip, the bonding layer is disposed between the first and the second chips and can be an adhesive, thermally conductive or electrically conductive layer, e.g., an adhesion film/paste or a metal layer. The second semiconductor chip is formed on the bonding layer, a plurality of second electrical bonding pads is formed on the upper surface of the second semiconductor chip and the lower surface thereof is bonded to the bonding layer. A plurality of third conductive vias may be formed in the second substrate to electrically connect the second patterned circuit layer to the second electrical bonding pads.

The present invention further provides a method for fabricating an embedded chip package. First, a first substrate is formed on a carrier plate, wherein the first substrate includes at least a first dielectric layer and at least a first patterned circuit layer formed on the first dielectric layer, wherein the first patterned circuit layer contacts the carrier plate. Next, a semiconductor structure comprising a plurality of first electrical bonding pads formed thereon on the first substrate, wherein the first electrical bonding pads contact the first substrate. Next, an encapsulating material layer is formed on the first substrate and the entire semiconductor structure. Furthermore, the carrier plate is removed and a plurality of first conductive vias are formed so as to electrically connect the first patterned circuit layer to the first electrical bonding pads.

The step of forming an encapsulating material layer on the first substrate and the entire semiconductor structure includes, for example, coating, press molding, potting or injection molding process. The material of the encapsulating material layer includes, for example, epoxy, molding compound or potting/casting compound. The semiconductor structure may be a semiconductor chip having a plurality of first electrical bonding pads. The semiconductor structure may also comprise a semiconductor chip and a cover layer which can be a thermally/electrically conductive layer, e.g., a metal layer, while a plurality of first electrical bonding pads is located on the semiconductor chip. The semiconductor structure may further comprise a first semiconductor chip, a between-chip bonding layer and a second semiconductor chip, wherein the first electrical bonding pads are disposed on the first semiconductor chip, the bonding layer is disposed between the first and the second chips and can be an adhesive, thermally conductive or electrically conductive layer, e.g., an adhesion film/paste or a metal layer. The second semiconductor chip is formed on the bonding layer. A plurality of second electrical bonding pads is formed on the upper surface of the second semiconductor chip and the lower surface of the second semiconductor chip is bonded to the bonding layer.

Before forming the first conductive vias in the first substrate, a second substrate may be formed on the encapsulating material layer and the semiconductor structure, wherein the second substrate includes at least a second dielectric layer and at least a patterned circuit layer formed on the second dielectric layer, and the second dielectric layer contacts the semiconductor structure. A plurality of second conductive vias may be formed in the first substrate, the second substrate and the encapsulating material layer to electrically connect the first patterned circuit layer to the second patterned circuit layer. The encapsulating material layer can also be formed between the semiconductor chip and the second substrate. The semiconductor structure may be a semiconductor chip having a plurality of first electrical bonding pads. The semiconductor structure may also comprise a semiconductor chip and a metal layer, wherein the first electrical bonding pads are located on the semiconductor chip. The semiconductor structure may further include a first semiconductor chip, a between-chip bonding layer and a second semiconductor chip, wherein a plurality of first electrical bonding pads is formed on the first semiconductor chip, the bonding layer is disposed between the first and the second chips and can be an adhesive, thermally conductive or electrically conductive layer, e.g., an adhesion film/paste or a metal layer. The second semiconductor chip is formed on the bonding layer. A plurality of second electrical bonding pads may be formed on the upper surface of the second semiconductor chip and the lower surface thereof contacts the bonding layer. A plurality of third conductive vias may be formed in the second substrate to electrically connect the second patterned circuit layer to the second electrical bonding pads.

The present invention adopts an architecture, wherein an encapsulating material layer substitutes the core layer in the substrate of a conventional package. Thus, various disadvantages of the prior art described above effectively avoided. The encapsulating material layer can be used to support the semiconductor chip and the package's circuit layer and protect the semiconductor chip and the package. The material of the encapsulating material layer preferably comprises a coefficient of thermal expansion (CTE) close to that of the semiconductor chip's or has a capability of absorbing stress to reduce the stress caused by a CTE mismatch between different materials to the chip. The thermally/electrically conductive layer, e.g., a metal layer, in the architecture of the present invention is helpful to dissipate the whole package and reduce external electro-magnetic interference (EMI) or between the embedded and stacked chips. Contrary to the prior art, the architecture of the present invention allows integration of more number of chips in a single embedded chip package and thereby enhance the integration and efficiency of the device. On the other hand, bonding pads can be formed on two surfaces of the embedded chip package and can serve as a carrier for another package to form a stacked chip package. Thus, the cavity process of the prior art can be avoided. More particularly, the method of the present invention is compatible with the present semiconductor process and therefore the process is simple and effectively reduces the fabrication cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following, the embedded chip packages of the present embodiments 1-9 are explained in detail, wherein the same components in the embodiments are assigned by the same marks and the duplicate depictions are omitted.

FIGS. 1, 2(a)-2(d) and 3(a)-3(b) are structure diagrams respectively corresponding to the embodiments 1-3, wherein all the packages are embedded chip packages on a single substrate.

Figure 1:
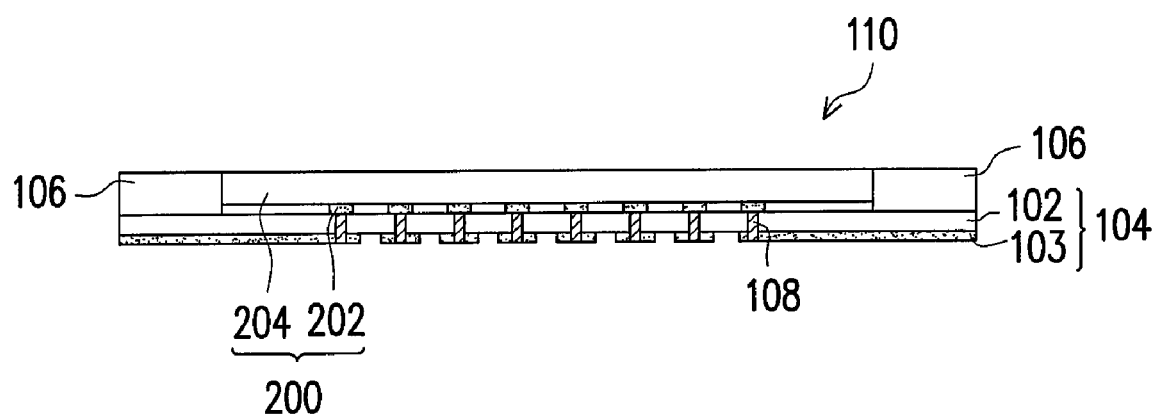
FIGS. 1, 2(a)-2(d), 3(a) and 3(b), 4, 5(a)-5(c), 6(a) and 6(b), 7, 8(a)-8(c) and 9(a) and 9(b) are cross-sectional drawings of embedded chip packages respectively corresponding to the embodiments 1-9 of the present invention.

FIG. 1 is a cross-sectional drawing of the embedded chip package according to the first embodiment of the present invention. The embedded chip package 110 of the embodiment mainly comprises a substrate 104, a semiconductor structure 200, an encapsulating material layer 106 and a plurality of conductive vias 108.

The substrate 104 herein mainly comprises a dielectric layer 102 and a patterned circuit layer 103 disposed on the dielectric layer 102. The material of the dielectric layer 102 is, for example, polyimide (PI), fiber reinforcement substrate (FR-4)/(FR-5), bismaleimide-triazine (BT), epoxy resin or other appropriate dielectric materials. The material of the patterned circuit layer 103 is, for example, a conductive material such as copper foil. The semiconductor structure 200 is disposed on the substrate 104. A plurality of electrical bonding pads 202 is disposed on the semiconductor chip 204 and contacts the dielectric layer 102. The material of the electrical bonding pads 202 is, for example, aluminum, copper, nickel/gold or other appropriate conductive materials. In the embodiment, the semiconductor structure 200 is formed by disposing the electrical bonding pads 202 on the semiconductor chip 204, wherein the semiconductor chip 204 is, for example, a silicon chip. In addition, a plurality of conductive vias 108 is disposed in the substrate 104 to electrically connect the patterned circuit layer 103 to the electrical bonding pads 202. The material of the conductive vias 108 is, for example, copper, silver, solder alloy or other appropriate materials.

The embedded chip package 110 further includes an encapsulating material layer 106, which is disposed on the substrate 104 and around the semiconductor structure 200. The material of the encapsulating material layer 106 is, for example, molding compound or potting/casting compound, such as epoxy resin, macromolecule material containing silica or other appropriate materials. In particular, the encapsulating material layer 106 serves to strengthen and protect the semiconductor chip. On the other hand, since the encapsulating material layer 106 has a CTE close to that of the semiconductor chip 204 or has a capability of stress absorption, the stress between the encapsulating material layer 106 and the semiconductor chip 204 caused by a differential CTE can be reduced. The encapsulating material layer 106 can be disposed around semiconductor structure 200 only to produce a mechanically symmetric structure in contrast to the prior art where the packaging material un-symmetrically covers the whole device. In particular, in case where the semiconductor chip is not thinned by performing a lapping process or has a thicker thickness, the package of the present invention does not require a cavity process as required by the conventional packaging process. Thus, the packaging process can be simplified and the fabrication cost can be reduced.

Figure 2:
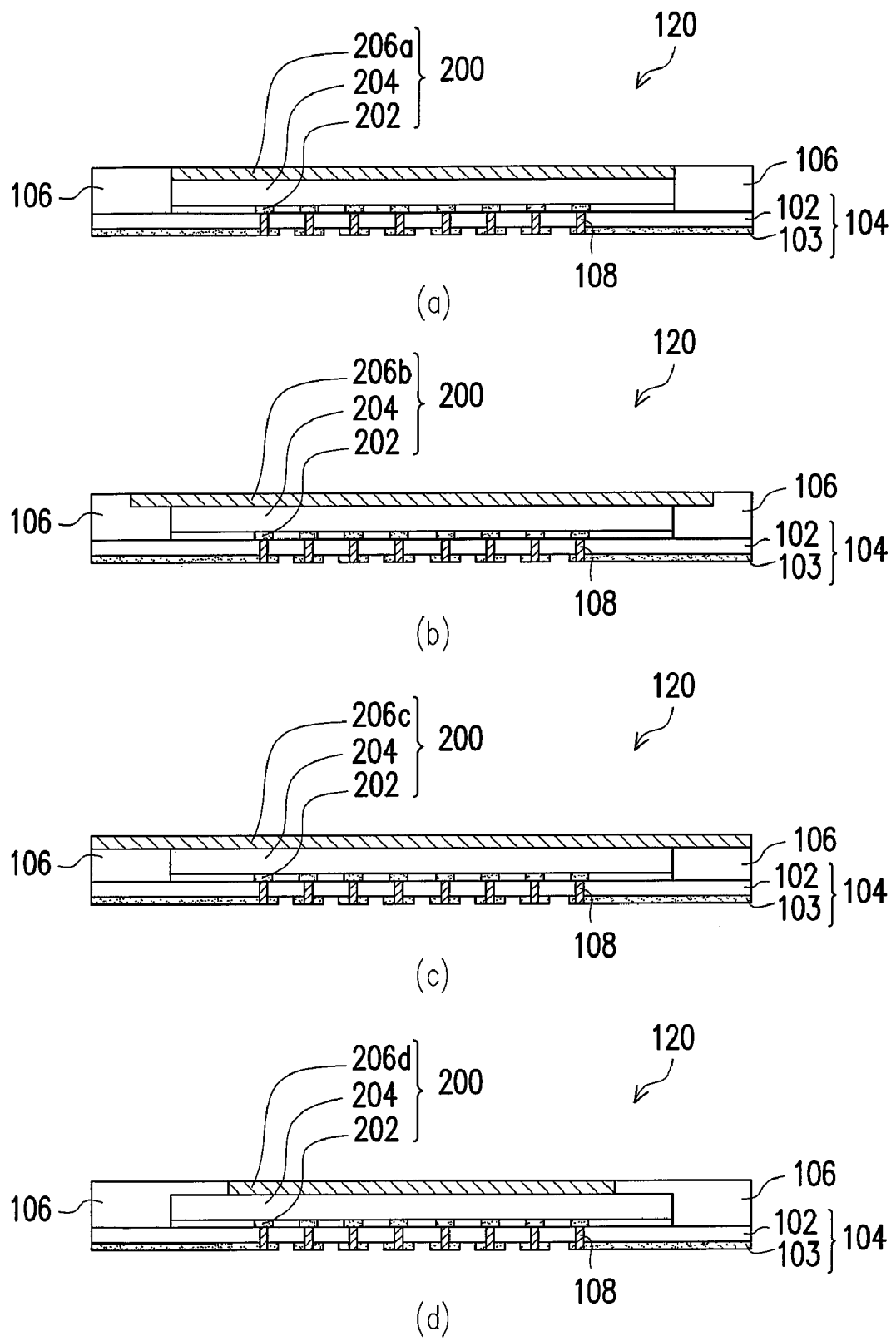

FIGS. 2(a)-2(d) are cross-sectional drawings of the embedded chip package according to the second embodiment of the present invention. The embedded chip package 120 of the embodiment is similar to the embedded chip package 110 of the above-mentioned embodiment, except that the semiconductor structure 200 in the embedded chip package 120 further includes a cover layer 206a, 206b, 206c and 206d disposed on the semiconductor chip 204. The cover layer 206a may be disposed on the semiconductor chip 204 and the size of the cover layer 206a is equal to that of the semiconductor chip 204 as shown in FIG. 2(a). The cover layer 206b may be disposed on the semiconductor chip 204 and on a portion of the encapsulating material layer 106 as shown in FIG. 2(b). The cover layer 206c may be disposed on the semiconductor chip 204 and the encapsulating material layer 106 as shown in FIG. 2(c). The cover layer 206d may be disposed on the semiconductor chip 204 and the size of the cover layer 206d is smaller than that of the semiconductor chip 204 as shown in FIG. 2(d). The cover layer 206a, 206b, 206c and 206d can be a thermally or electrically conductive layer, e.g., a metal layer. The material of the metal layer is, for example, copper, aluminum or other appropriate metal materials. The cover layer 206a, 206b, 206c or 206d is employed to dissipate the package and reduce external electron magnetic interfering (EMI) or EMI between the embedded and stacked chips.

Figure 3:
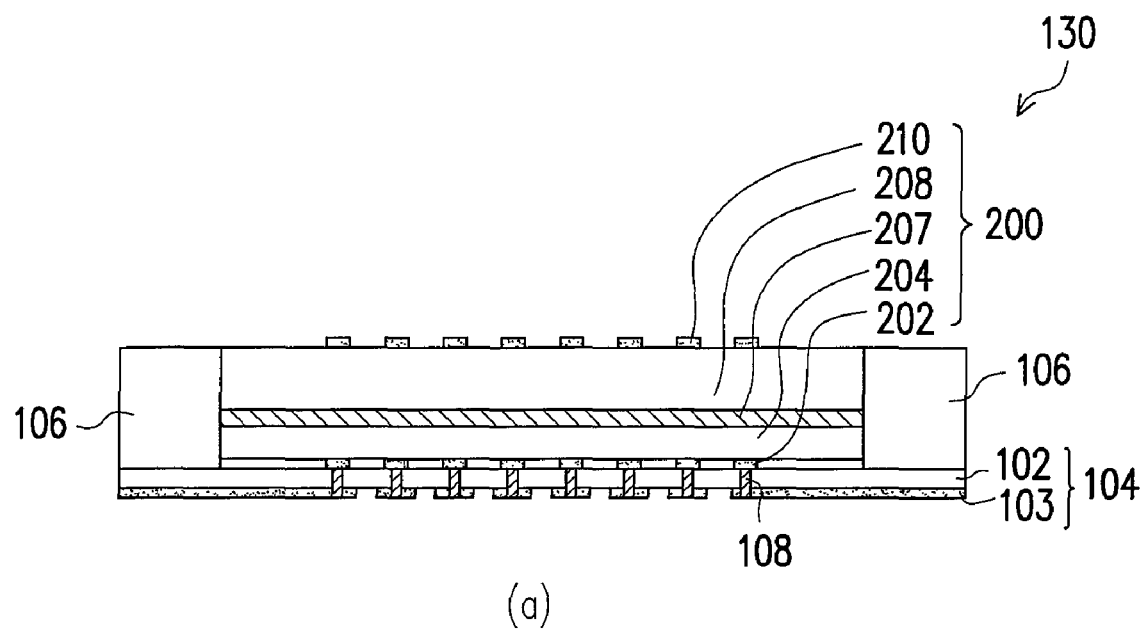
Figure 3:
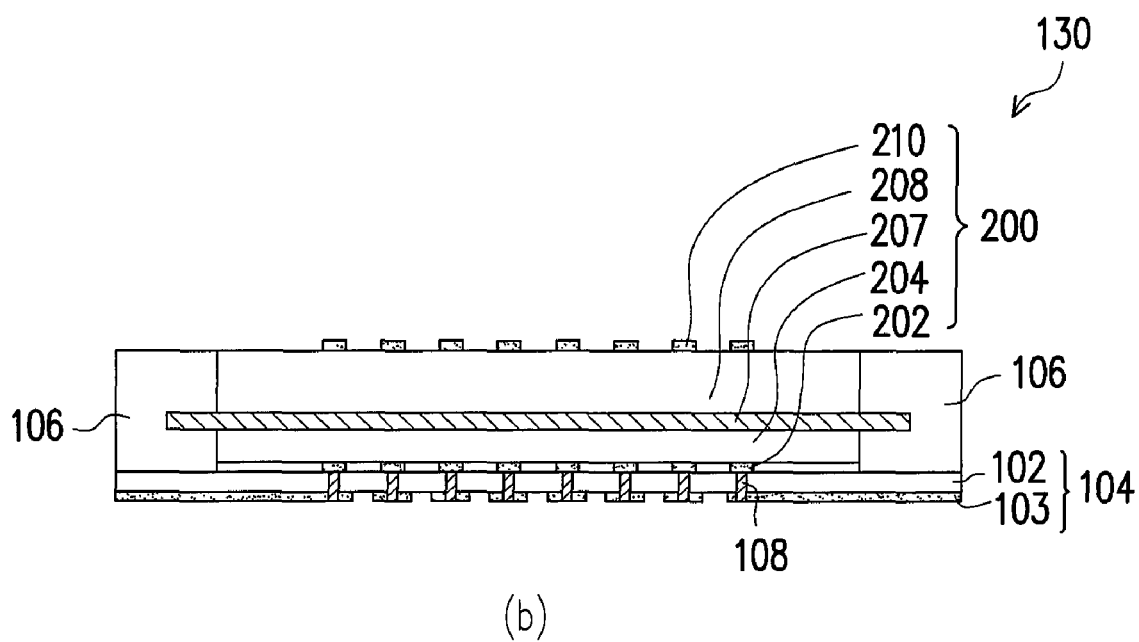
Figure 4:
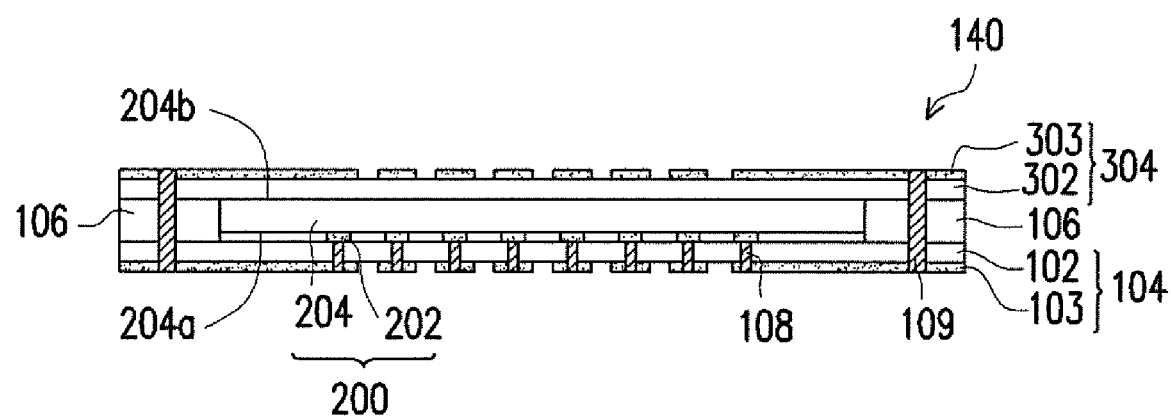
Figure 5:
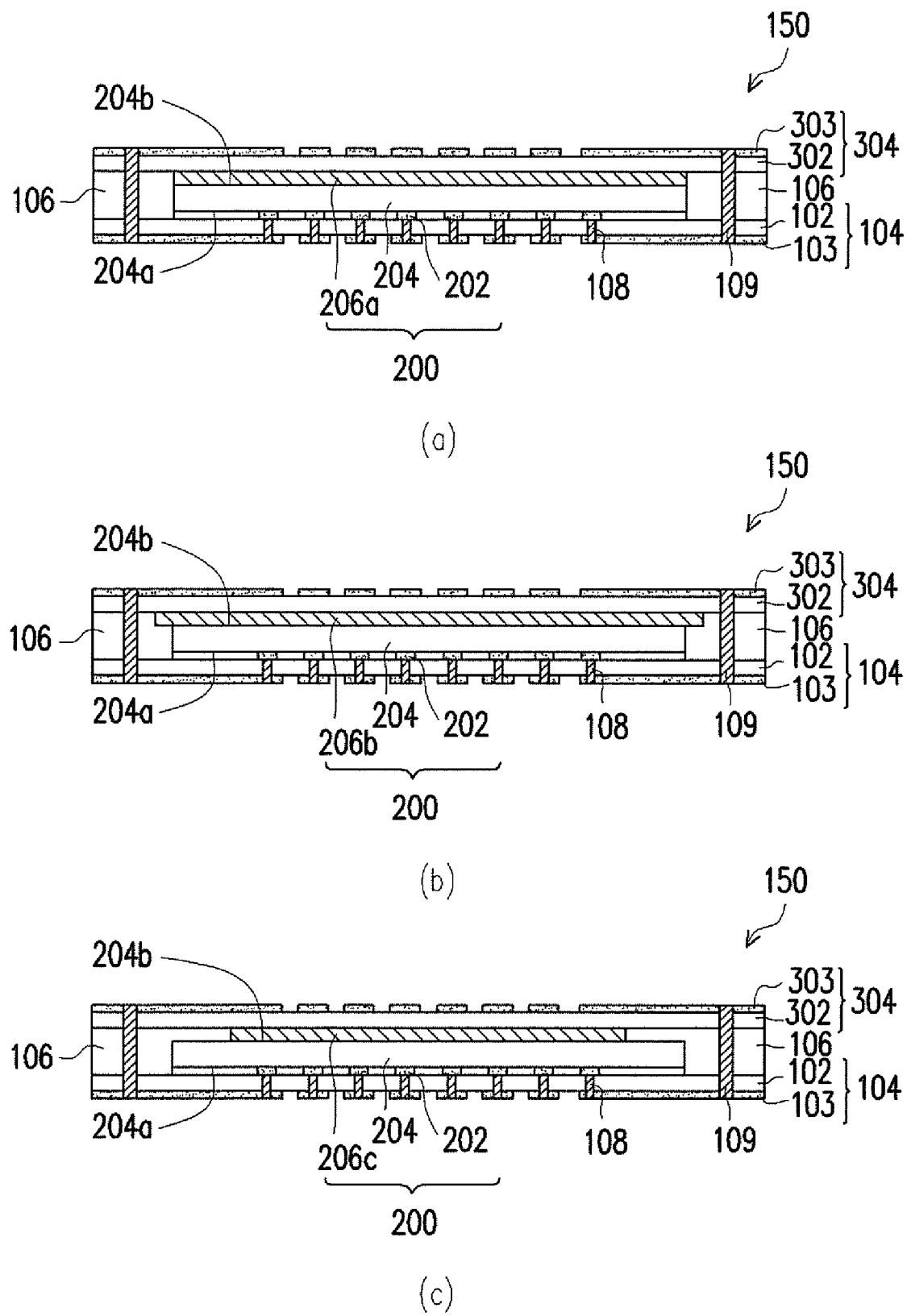

FIGS. 3(a) and 3(b) are cross-sectional drawings of the embedded chip package corresponding to the embodiment 3 of the present invention. The embedded chip package 130 of the embodiment is similar to the embedded chip package 110 of the above-mentioned embodiment, except that the semiconductor structure 200 in the embedded chip package 130 further includes a semiconductor chip 208 and a bonding layer 207. The semiconductor chip 208 is disposed over the semiconductor chip 204, a plurality of electrical bonding pads 210 is disposed on the upper surface of the semiconductor chip 208 and the lower surface thereof contacts the bonding layer 207. The material of the electrical bonding pads 210 is, for example, aluminum, copper, nickel/gold or other appropriate conductive materials. The bonding layer 207 is disposed between the semiconductor chip 204 and the semiconductor chip 208 and is comprised of an adhesive layer or a metal layer. FIG. 3(a) shows the structure of the embedded chip package 130 including the bonding layer 207 is an adhesive layer connecting the semiconductor chips 204 and 208; and FIG. 3(b) shows the structure of the embedded chip package 130 including the bonding layer 207 is a metal layer to dissipate heat. In the present embodiment, the semiconductor structure 200 includes the semiconductor chip 204 and the semiconductor chip 208, which means that the embedded chip package 130 has two embedded chips. Thus, both the integration and the efficiency of the embedded chip package are effectively increased.

FIGS. 4, 5(a)-5(c), 6(a) and 6(b), 7, 8(a)-8(c) and 9(a) and 9(b) are cross-sectional drawings of the embedded chip packages respectively corresponding to the embodiments 4-9 of the present invention, wherein each of all the embedded chip packages comprises two substrates.

Figure 6:
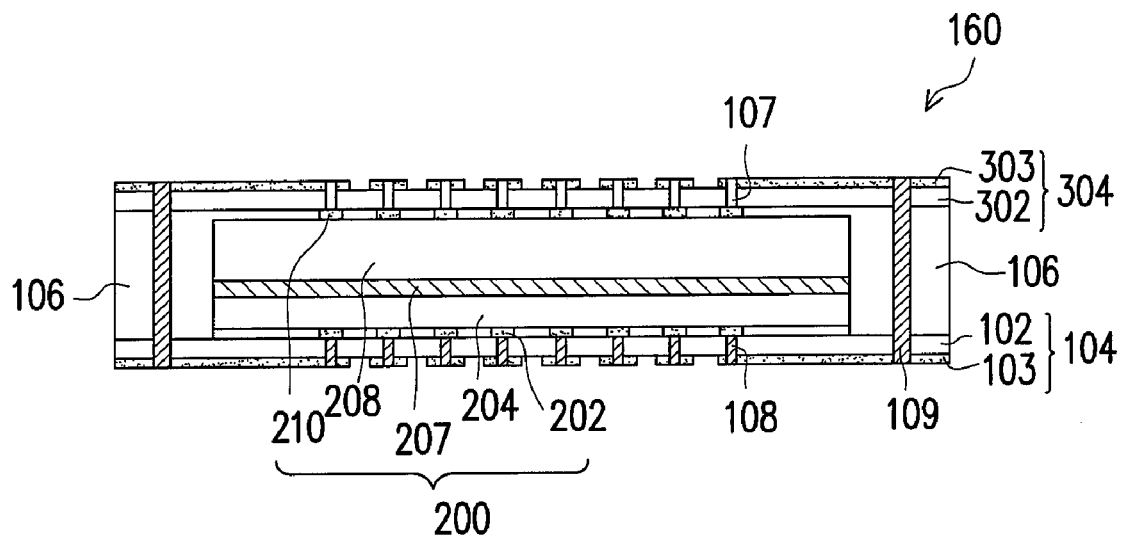
Figure 6:
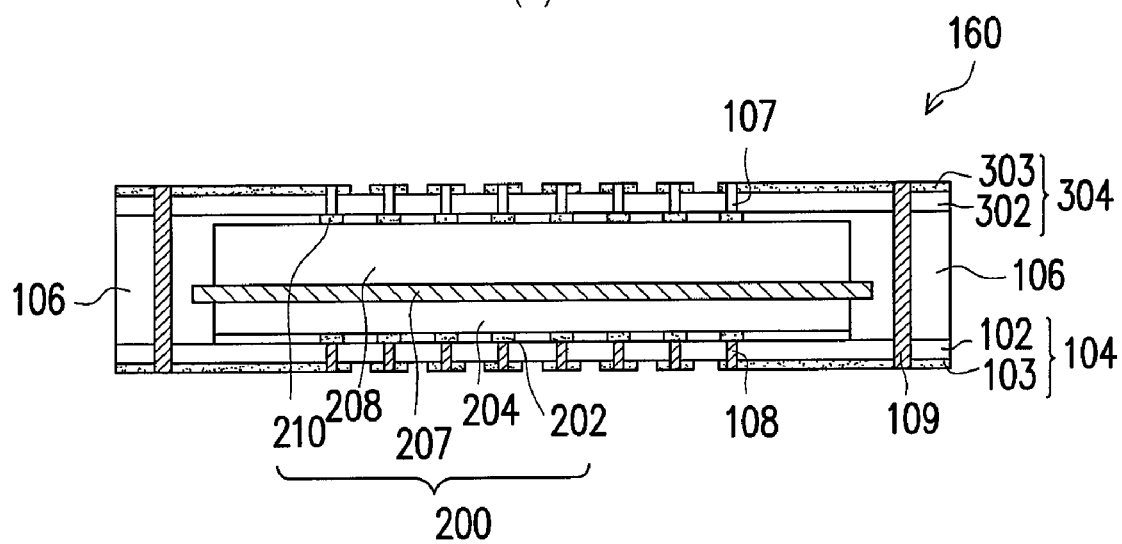
Figure 7:
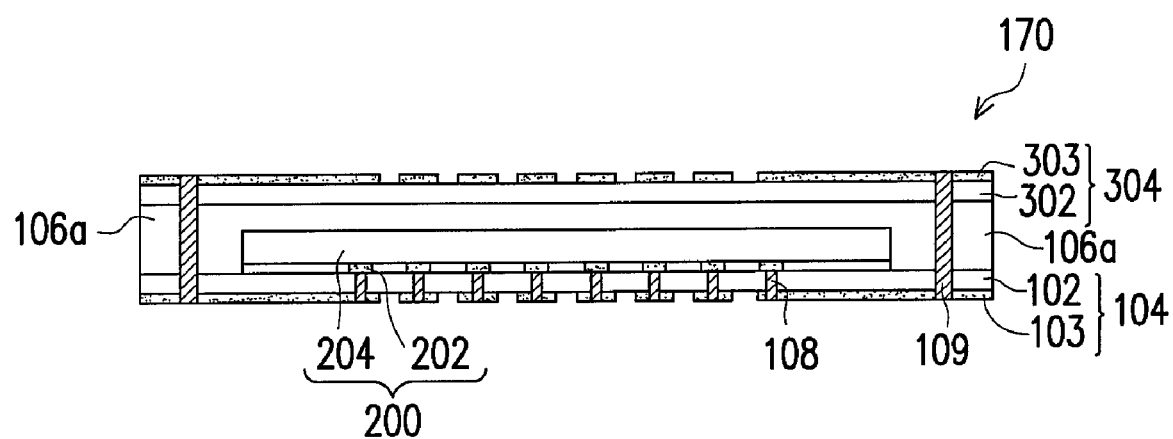
Figure 8:
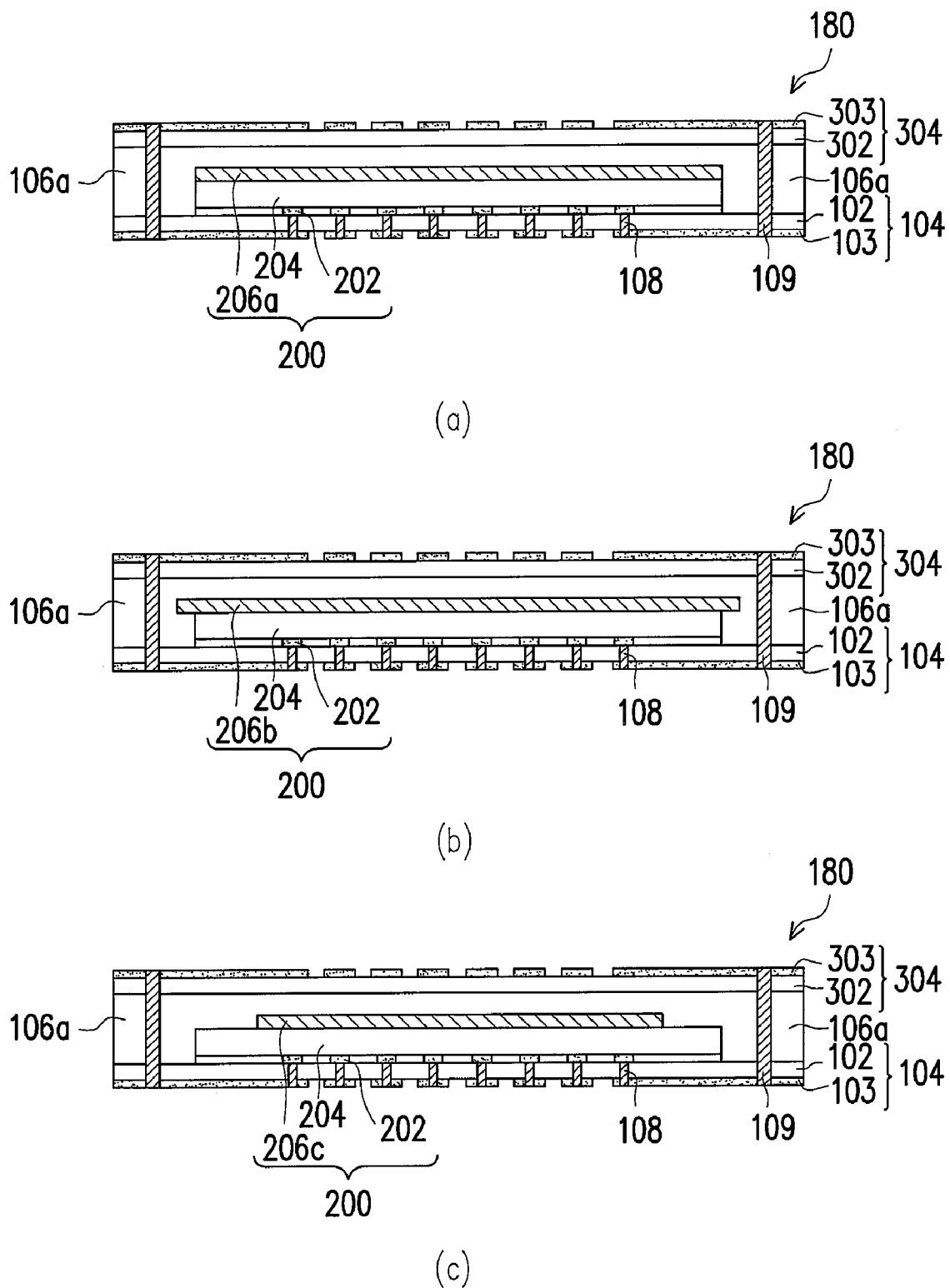
Figure 9:
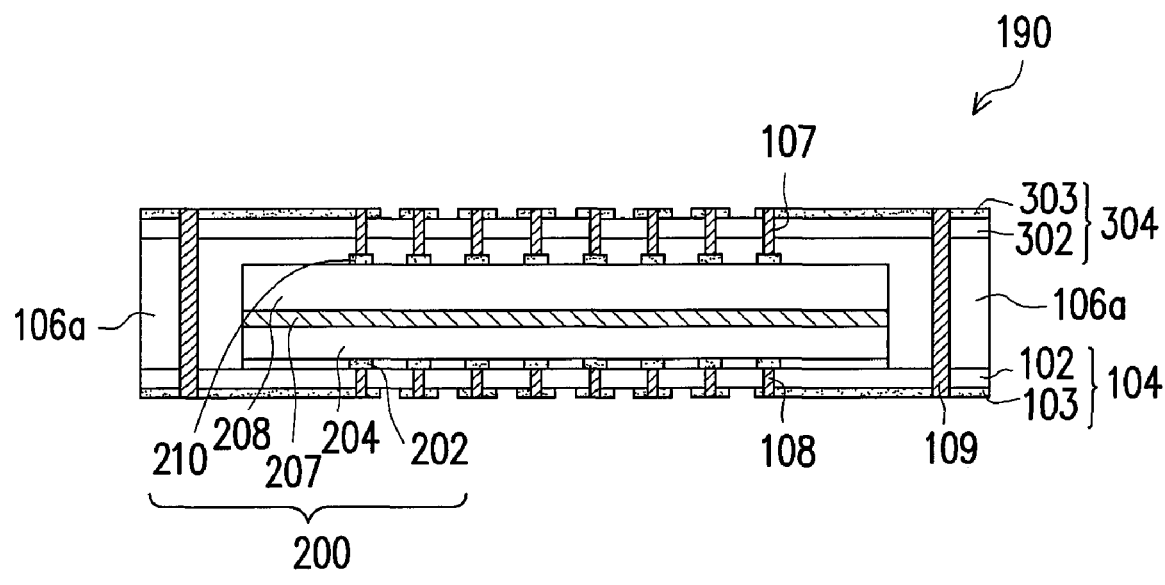
Figure 9:
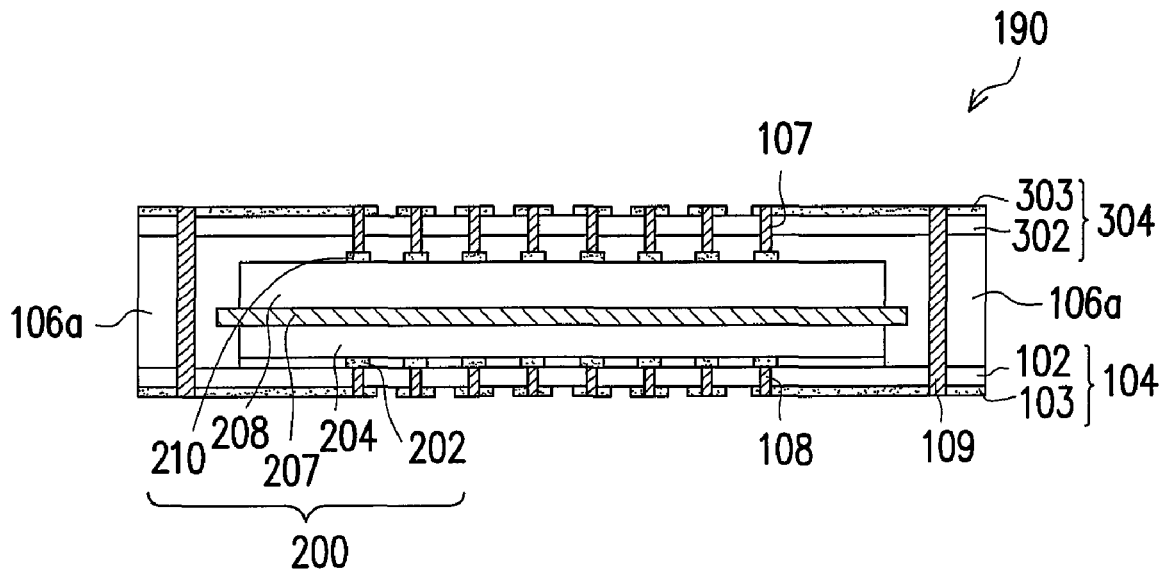

Referring to FIGS. 4, 5(a)-5(c) and 6(a)-6(b), the embedded chip packages 140, 150 and 160 sequentially corresponding to the embodiments 4-6 are respectively similar to the embedded chip packages 110, 120 and 130, except that the embedded chip packages 140, 150 and 160 further respectively includes a substrate 304 comprising a dielectric layer 302 and a patterned circuit layer 303 disposed on the dielectric layer 302. The plurality of electrical bonding pads 202 is disposed on a first surface 204a of the semiconductor chip 204. The substrate 304 is disposed on the semiconductor structure 200 and the encapsulating material layer 106, and the dielectric layer 302 contacts a second surface 204b of the semiconductor chip 204 and the encapsulating material layer 106. The material of the dielectric layer 302 is, for example, polyimide (PI), fiber reinforcement substrate (FR-4)(FR-5), bismaleimide-triazine (BT), epoxy resin or other appropriate materials. The material of the patterned circuit layer 303 is, for example, a conductive material such as copper foil. In addition, the embedded chip packages 140, 150 and 160 respectively include a plurality of conductive vias 109 disposed in the substrate 304, the encapsulating material layer 106 and the substrate 104 to electrically connect the patterned circuit layer 303 to the patterned circuit layer 103. The material of the conductive vias 109 is, for example, a conductive material such as copper, silver, solder alloy or other appropriate materials. In FIGS. 6(a) and 6(b), the embedded chip package 160 further includes a plurality of conductive vias 107 disposed in the substrate 304 to electrically connect the patterned circuit layer 303 to the electrical bonding pads 210. The material of the conductive vias 107 is, for example, a conductive material such as copper, silver, solder alloy or other appropriate materials.

Referring to FIGS. 7, 8(a)-8(c) and 9(a)-9(b), the embedded chip packages 170, 180 and 190 sequentially corresponding to of the embodiment 7-9 are respectively similar to the embedded chip packages 140, 150 and 160, except that the encapsulating material layer 106a of the embedded chip packages 170, 180 and 190 is being disposed around the semiconductor structure 200 and cover the semiconductor structure 200.

The present invention employs an encapsulating material layer to substitute the conventional cavity for fabricating an embedded chip package, thus, the fabrication cost can be saved. According to the present invention, the back surfaces of the two chips are attached to each other and embedded within the package to increase the integration the chip package and also promote the efficiency of the chip package. Moreover, a cover layer is disposed in the chip package of the present invention to assist to dissipate heat from the chip package and reduce external EMI or EMI between the embedded and stacked chips. Besides, two substrates are disposed in the chip package of the present invention so that the bonding pads may be formed on the two surfaces thereof and can be serve as a carrier for the stacked chip package.

The stacked chip package described hereinafter includes a carrier component and at least a chip package, wherein the chip package is disposed on the carrier component and electrically connects the carrier component. The chip package can be one or more than one according to the requirement, which the present invention does not limit. However, the following embodiments illustrate the stacked chip package with a chip package only.

Figure 10A:
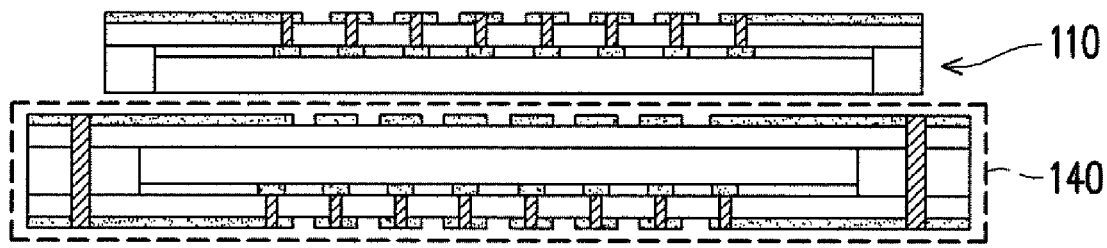
FIGS. 10A-10D are cross-sectional drawings of a stacked chip package according to an embodiment of the present invention.
Figure 10B:
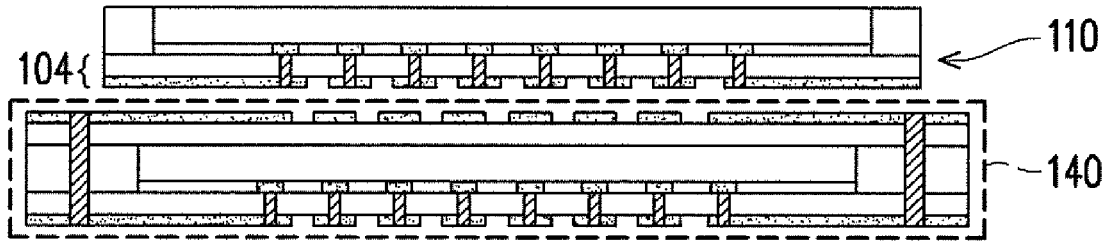
Figure 10C:
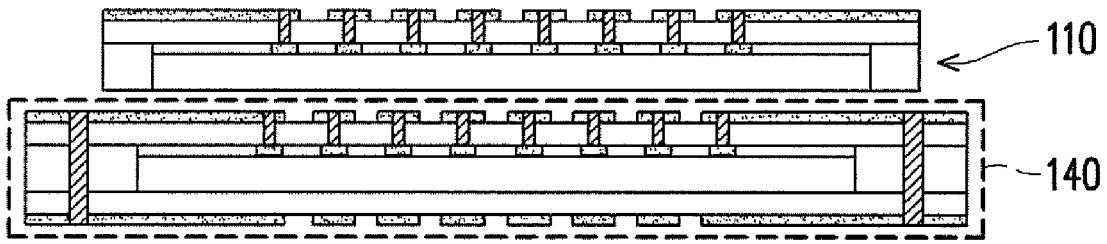
Figure 10D:
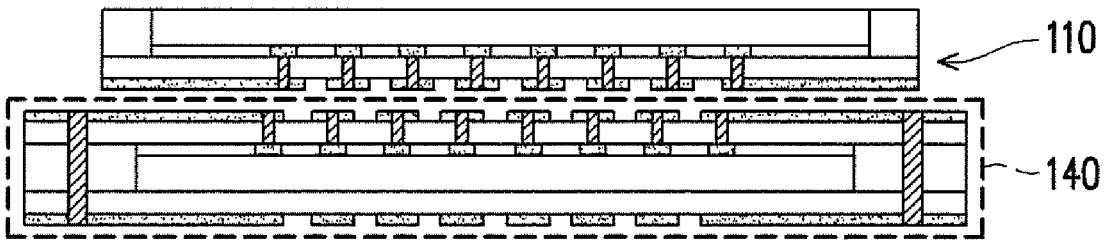

FIG. 10A is a cross-sectional drawing of a stacked chip package according to an embodiment of the present invention. The carrier component can be an embedded chip package 140, while the chip package can be an embedded chip package 110. The disposition relationship between the embedded chip package 110 and the embedded chip package 140 is not limited to the embodiment shown in FIG. 10A. In fact, the substrate 104 of the embedded chip package 110 can be downwards disposed on the embedded chip package 140 (as shown in FIG. 10B) or as shown in FIG. 10C or FIG. 10D. It should be noted that as shown in FIGS. 10A and 10C, the embedded chip packages 110 and 140 are electrically connected to each other by wire bonding, and as shown in FIGS. 10B and 10D, the embedded chip packages 110 and 140 are electrically connected to each other by using metal bumps, i.e., by forming a plurality of solder balls.

In other embodiments, the carrier component of the stacked chip package provided by the present invention can be one of the embedded chip packages 140, 150, 160, 170, 180 and 190, while the chip package thereof can be one of the embedded chip packages 110, 120 and 130. Those skilled in the art may be able to easily implement other embodiments of a stacked chip package according to the above description, and therefore other embodiments are omitted herein for simplicity, but they shall be construed to be within the scope of the present invention.

Note that FIGS. 10A-10D are diagrams of the structures only; the present invention does not limit what carrier component the stacked chip package uses and what dimensions the chip package must have.

The method for fabricating the embedded chip package of the present invention is described in a plurality of process manners in the following, where the same components in the figures are indicated by the same marks and the duplicate depiction would be avoided for simplicity.

FIGS. 11A-11D are process flow cross-sectional drawings showing a method for fabricating the embedded chip packages according to the embodiments 1-3 of the present invention.

Figure 11A:
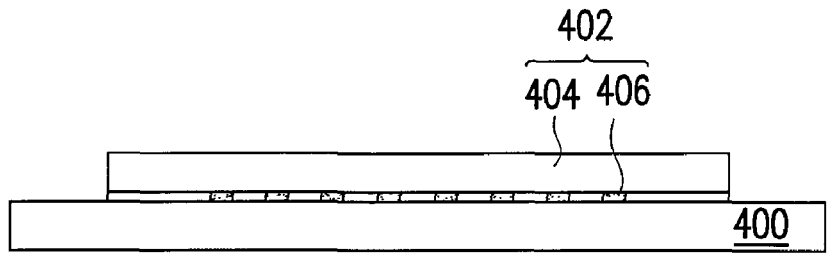
FIGS. 11A-11D are process flow cross-sectional drawings showing a method for fabricating the embedded chip packages according to the embodiments 1-3 of the present invention.

Referring to FIG. 11A, a carrier plate 400 is provided. The carrier plate 400 is, for example, a supporting metal plate, a supporting insulation plate or other appropriate carrier plate.

The semiconductor structure 402 is formed on the carrier plate 400, wherein the semiconductor structure 402 is formed, for example, by using adhesive to adhere the semiconductor structure 402 to the carrier plate 400. For the structure of the first embodiment (referring to FIG. 1) for example, the semiconductor structure 402 is a semiconductor chip 404 having a plurality of electrical bonding pads 406, and the electrical bonding pads 406 on the semiconductor structure 402 contact the carrier plate 400. The material of the electrical bonding pads 406 is, for example, aluminum, copper, nickel/gold or other appropriate conductive materials.

For the structure of the second embodiment (referring to FIGS. 2(a)-2(d)) for example, the semiconductor structure 402 further includes a cover layer (not shown), formed on the semiconductor chip 404. The cover layer can be a thermally or electrically conductive layer, e.g., a metal layer, which is, for example, copper, aluminum or other appropriate metal/alloy materials. This layer is able to assist to dissipate the heat and reduce external EMI so as to enhance the chip performance. For the structure of the third embodiment (referring to FIGS. 3(a) and 3(b)) for example, the semiconductor structure 402 further includes another semiconductor chip (not shown) formed on the semiconductor chip 404 and a bonding layer, wherein the bonding layer is formed between the two semiconductor chips and on both of the semiconductor chips a plurality of electrical bonding pads is respectively formed (not shown).

Figure 11B:
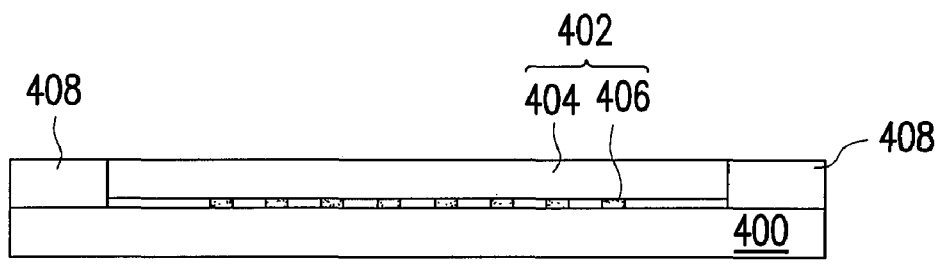

Referring to FIG. 11B, a press molding, potting or injecting-filling step is performed to form an encapsulating material layer 408 on the carrier plate 400 and around the semiconductor structure 402. The material of the encapsulating material layer 408 is, for example, molding compound or potting/casting compound such as epoxy resin, macromolecule material containing silica or other appropriate materials. In more detail, the step for forming the encapsulating material layer 408 is, for example, covering a mold on the semiconductor structure and then injecting a molding compound material into the molding so as to directly form the encapsulating material layer 408 on the carrier plate 400 and around the semiconductor structure 402. The step for forming the encapsulating material layer 408 can also be, for example, to conduct a press molding; that is, a molding compound material layer is formed on the carrier plate 400 to cover the semiconductor structure 402, and then, a part of the molding compound material layer is removed to expose the semiconductor structure 402 and form the encapsulating material layer 408. In the above-mentioned method, the required chip thickness can also be obtained by removing a portion of the molding compound material layer and a portion of the semiconductor structure 402 according to different process needs.

Figure 11C:
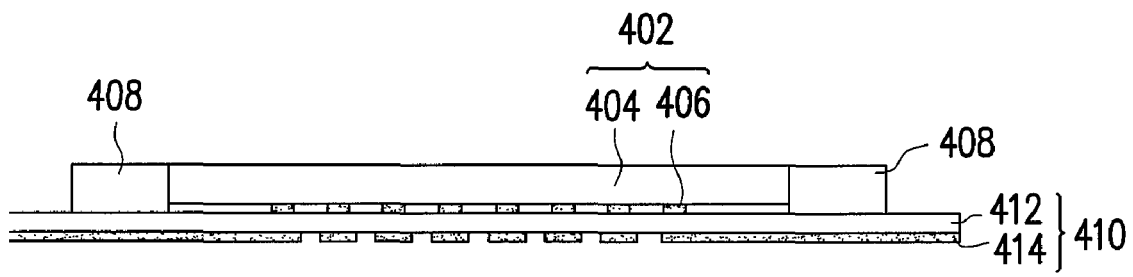

Referring to FIG. 11C, after forming the encapsulating material layer 408, the carrier plate 400 is removed. Then, a substrate 410 is formed on the encapsulating material layer 408 and the semiconductor structure 402. The substrate 410 mainly includes a dielectric layer 412 and a patterned circuit layer 414 formed on the dielectric layer 412. The material of the dielectric layer 412 is, for example, polyimide (PI), fiber reinforcement substrate (FR-4)/(FR-5), bismaleimide-triazine (BT), epoxy resin or other appropriate materials. The material of the patterned circuit layer 414 is, for example, a conductive material such as copper foil. The step for forming the substrate 410 on the encapsulating material layer 408 and the semiconductor structure 402 is, forming a dielectric layer 412 and a patterned circuit layer 414 to constitute the substrate 410, following by adhering the encapsulating material layer 408 and the semiconductor structure 402 to the substrate 410 with adhesive. The step for forming the substrate 410 on the encapsulating material layer 408 and the semiconductor structure 402 can also be, for example, forming a dielectric layer 412 on the encapsulating material layer 408 and the semiconductor structure 402, following by forming a patterned circuit layer 414 on the dielectric layer 412.

Figure 11D:
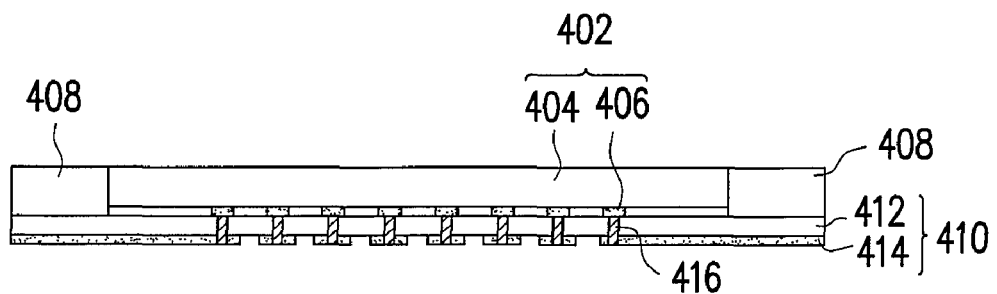

Referring to FIG. 11D, a plurality of conductive vias 416 is formed in the substrate 410 to electrically connect the patterned circuit layer 414 to the electrical bonding pads 406. The material of the conductive vias 416 is, for example, a conductive material, such as copper, silver, solder alloy or other appropriate materials. The step for forming the conductive vias 416 is, for example, by using a laser drilling process to form a plurality of through holes (not shown) in the substrate 410, followed by filling a conductive material in the through holes. After forming the conductive vias 416, a portion of the substrate 410 can be furthermore removed and the remained substrate 410 is cut and trimmed to fit the dimension requirements of different devices.

FIGS. 12A-12D are process flow cross-sectional drawings showing a method for fabricating the embedded chip packages according to the embodiments 4-6 of the present invention.

Figure 12A:
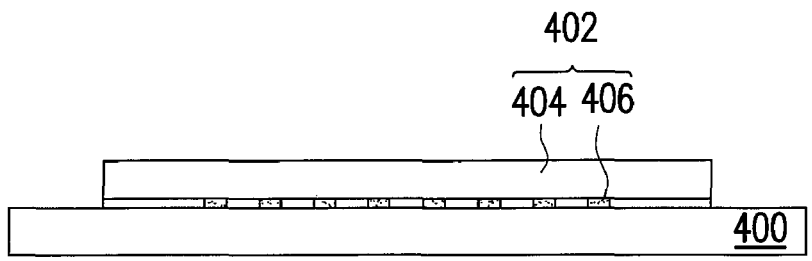
FIGS. 12A-12D are process flow cross-sectional drawings showing a method for fabricating the embedded chip packages according to the embodiments 4-6 of the present invention.
Figure 12B:
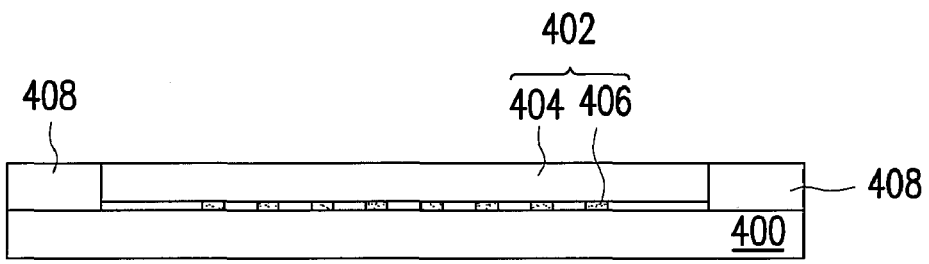

Referring to FIGS. 12A and 12B, the steps thereof are the same as FIGS. 11A and 11B; thus, all the components and the relationship thereof same as FIGS. 11A and 11B are omitted to describe for simplicity. For the structure of the forth embodiment (referring to FIG. 4) for example, the semiconductor structure 402 is formed by disposing a plurality of electrical bonding pads 406 on a semiconductor chip 404. For the structure of the fifth embodiment (referring to FIGS. 5(a)-5(c)) for example, the semiconductor structure 402 further includes a cover layer (not shown) formed on the semiconductor chip 404. The cover layer can be a thermally or electrically conductive layer, e.g., a metal layer. For the structure of the sixth embodiment (referring to FIGS. 6(a) and 6(b)) for example, the semiconductor structure 402 further includes another semiconductor chip (not shown) formed on the semiconductor chip 404 and a bonding layer, wherein the bonding layer is formed between the two semiconductor chips and on both of the semiconductor chips a plurality of electrical bonding pads is respectively formed (not shown).

Figure 12C:
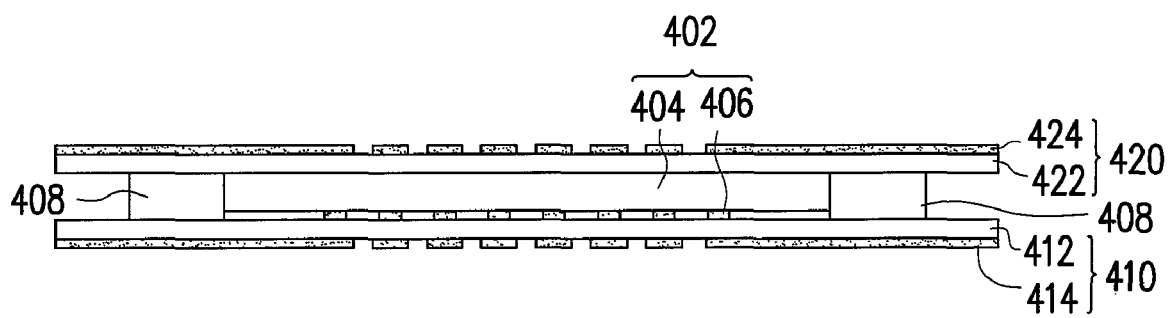

Referring to FIG. 12C, the carrier plate 400 is removed. Then, a substrate 410 and a substrate 420 is formed on the encapsulating material layer 408 and the semiconductor structure 402, wherein the substrate 410 mainly comprises a dielectric layer 412 and a patterned circuit layer 414, while the substrate 420 mainly comprises a dielectric layer 422 and a patterned circuit layer 424.

Figure 12D:
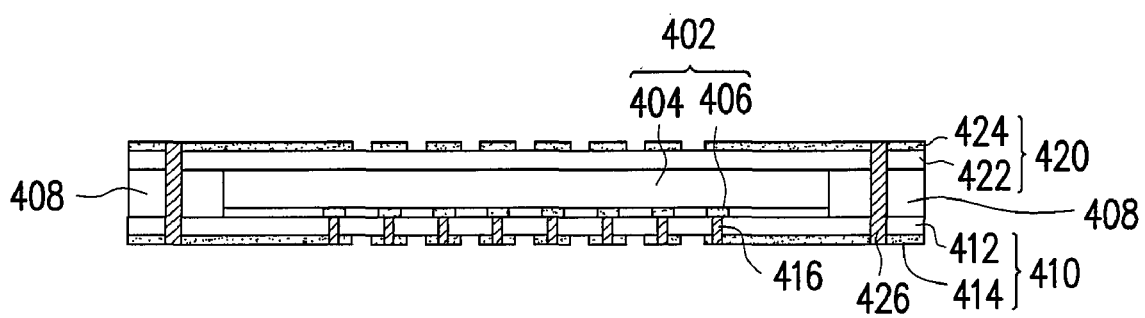
Figure 13A:
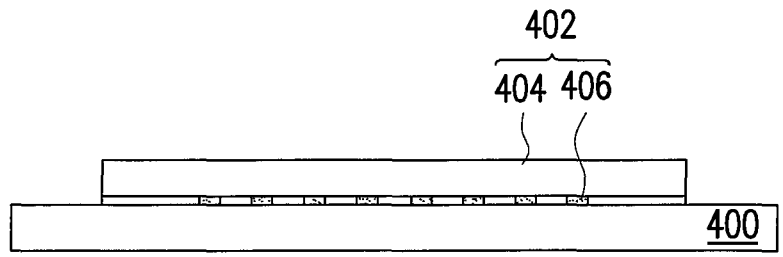
FIGS. 13A-13D are process flow cross-sectional drawings showing a method for fabricating the embedded chip packages according to the embodiments 7-9 of the present invention.
Figure 13B:
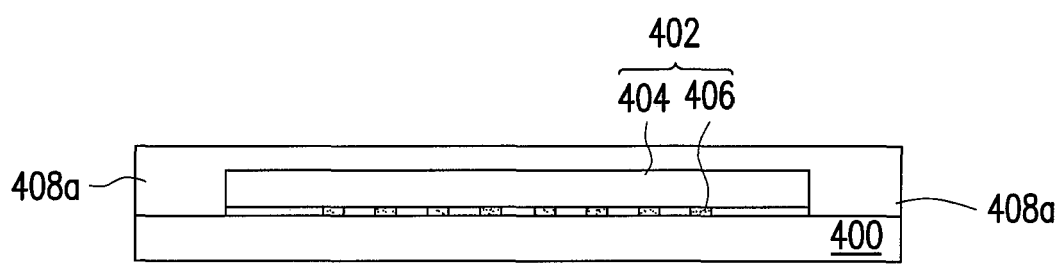
Figure 13C:
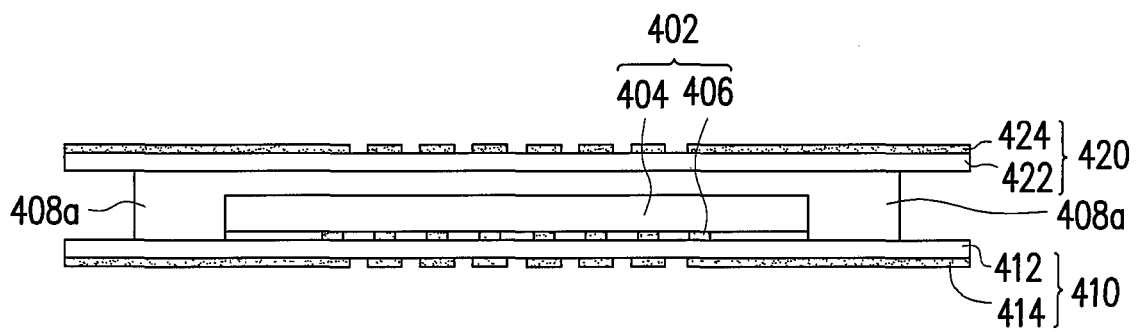
Figure 13D:
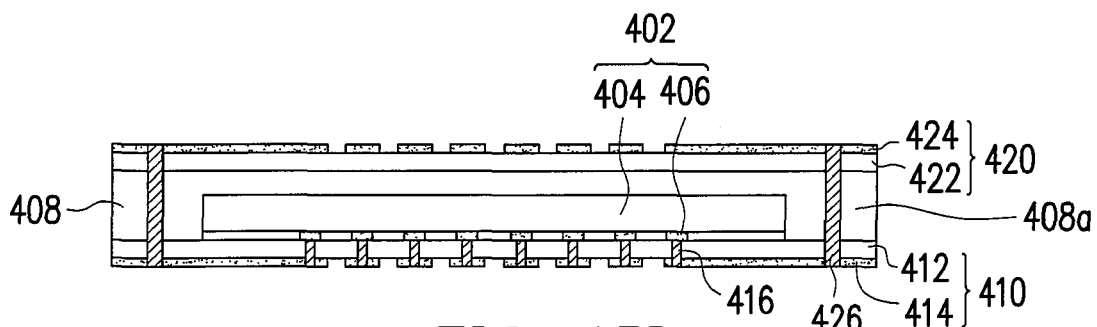

Referring to FIG. 12D further, a plurality of conductive vias 416 and a plurality of conductive vias 426 are formed to electrically connect the patterned circuit layer 414 to the electrical bonding pads 406 and the patterned circuit layer 424, respectively. The step of FIG. 12D for the sixth embodiment (referring to FIGS. 6(a) and 6(b)), for example, also includes forming a via hole (not shown) to electrically connect the patterned circuit layer 424 to the semiconductor structure 402. After forming the conductive vias 416 and 426, a portion of the substrate 410 and a portion of the substrate 420 can be furthermore removed and the remained substrates 410 and 420 are cut and trimmed to fit the dimension requirements of different devices.

FIGS. 13A-13D are process flow cross-sectional drawings showing a method for fabricating the embedded chip packages according to the embodiments 7-9 of the present invention. The steps of FIGS. 13A-13D are similar to the steps shown in FIGS. 12A-12D, except that the encapsulating material layer 408a herein is formed around the semiconductor structure 402 and covers the semiconductor structure 402. The step for forming the encapsulating material layer 408a is, for example, to conduct a press molding; that is, a molding compound material layer is formed on the carrier plate 400 to cover the semiconductor structure 402, and then, a portion of the molding compound material layer is removed to form the encapsulating material layer 408a according to different process requirements. Similarly, for the structure of the seventh embodiment (referring to FIG. 7) for example, the semiconductor structure 402 is formed by disposing a plurality of electrical bonding pads 406 on a semiconductor chip 404. For the structure of the eighth embodiment (referring to FIGS. 8(a)-8(c)) for example, the semiconductor structure 402 can further include a cover layer (not shown) formed on the semiconductor chip 404. The cover layer can be a thermally or electrically conductive layer, e.g., a metal layer. For the structure of the ninth embodiment (referring to FIGS. 9(a)-9(b)) for example, the semiconductor structure 402 further includes another semiconductor chip (not shown) formed on the semiconductor chip 404 and a bonding layer, wherein the bonding layer is formed between the two semiconductor chips and on both of the semiconductor chips a plurality of electrical bonding pads is respectively formed (not shown).

FIGS. 14A-14D are process flow cross-sectional drawings showing another method for fabricating the embedded chip packages according to the embodiments 1-3 of the present invention.

Figure 14A:
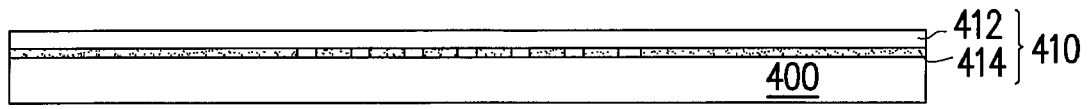
FIGS. 14A-14D are process flow cross-sectional drawings showing another method for fabricating the embedded chip packages according to the embodiments 1-3 of the present invention.

Referring to FIG. 14A, a carrier plate 400 is provided and a substrate 410 is formed on the carrier plate 400 The substrate 410 mainly includes a dielectric layer 412 and a patterned circuit layer 414 formed on the dielectric layer 412, wherein the patterned circuit layer 414 contacts the carrier plate 400.

Figure 14B:
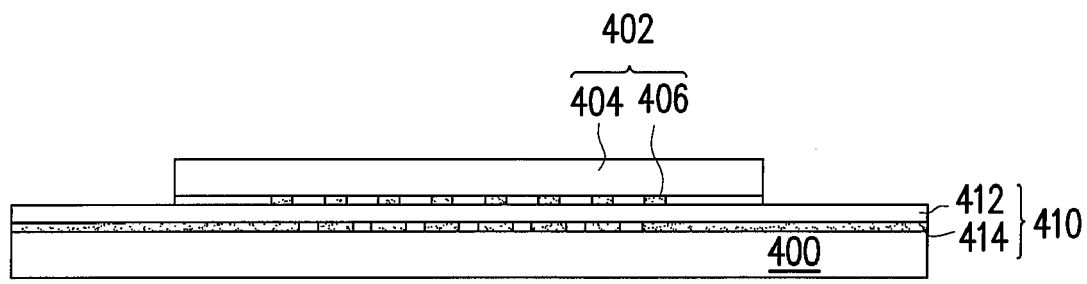

Referring to FIG. 14B, a semiconductor structure 402 is formed on the substrate 410. For the structure of the first embodiment (referring to FIG. 1) for example, the semiconductor structure 402 is formed by disposing a plurality of electrical bonding pads 406 on a semiconductor chip 404. For the structure of the second embodiment (referring to FIGS. 2(a)-2(d)) for example, the semiconductor structure 402 further includes a cover layer (not shown) formed on the semiconductor chip 404. The cover layer can be a thermally or electrically conductive layer, e.g., a metal layer. For the structure of the third embodiment (referring to FIGS. 3(a) and 3(b)) for example, the semiconductor structure 402 further includes another semiconductor chip (not shown) formed on the semiconductor chip 404 and a bonding layer, wherein the bonding layer is formed between the two semiconductor chips and on both of the semiconductor chips a plurality of electrical bonding pads is respectively formed (not shown).

Figure 14C:
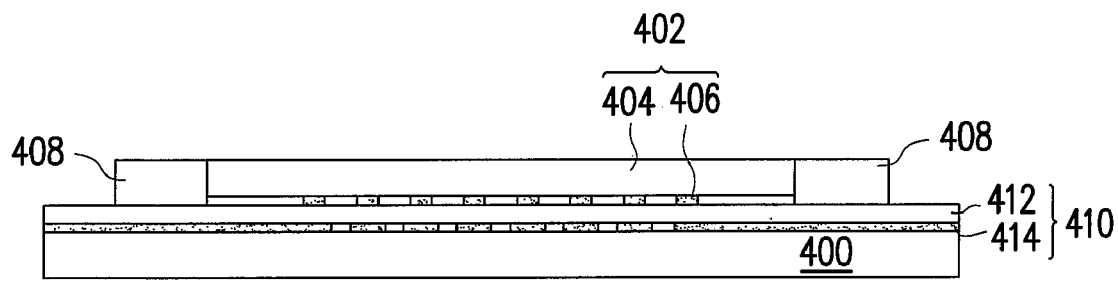

Referring to FIG. 14C then, an encapsulating material layer 408 is formed on the carrier plate 400 and around the semiconductor structure 402.

Figure 14D:
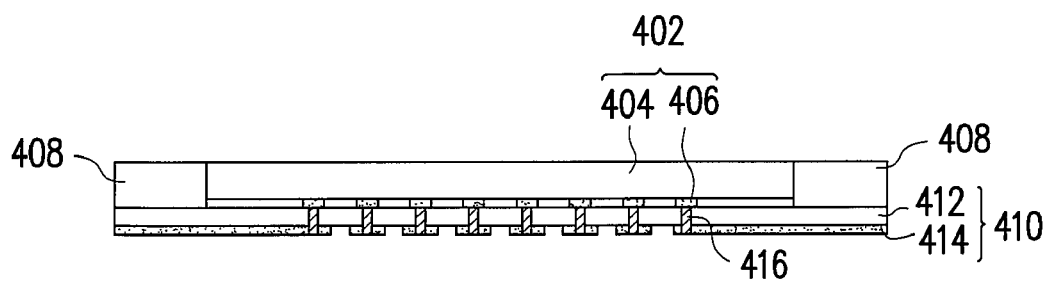

Referring to FIG. 14D further, after forming the encapsulating material layer 408, the carrier plate 400 is removed. Then, a plurality of conductive vias 416 is formed in the substrate 410 to electrically connect the patterned circuit layer 414 to the electrical bonding pads 406. After forming the conductive vias 416, a portion of the substrate 410 is further removed and the remained substrate 410 is cut and trimmed to fit the dimension requirements of different devices.

FIGS. 15A-15D are process flow cross-sectional drawings showing another method for fabricating the embedded chip packages according to the embodiments 4-6 of the present invention.

Figure 15A:
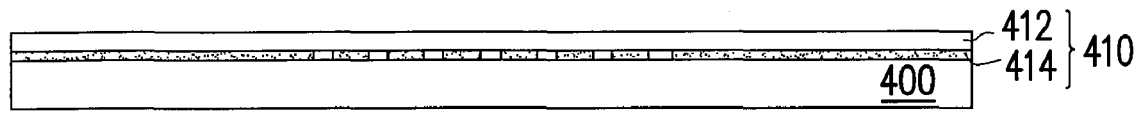
FIGS. 15A-15D are process flow cross-sectional drawings showing another method for fabricating the embedded chip packages according to the embodiments 4-6 of the present invention.
Figure 15B:
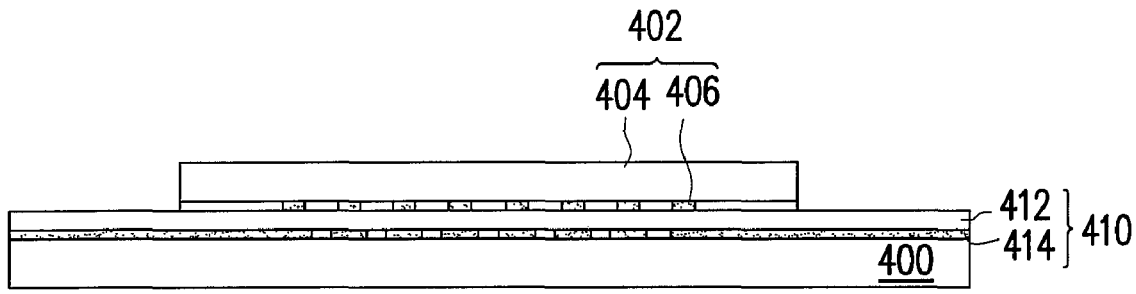
Figure 15C:
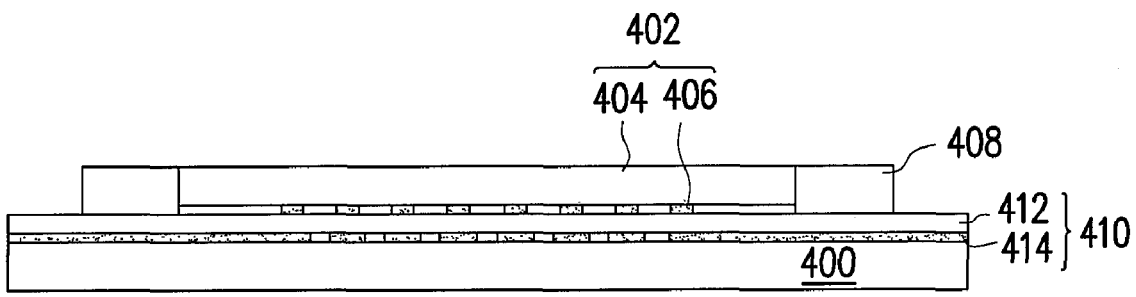

Referring to FIGS. 15A-15C, the steps thereof are the same as FIGS. 14A-14C. Thus, all the components and the relationship thereof same as FIGS. 14A-14C are omitted to describe for simplicity. For the structure of the forth embodiment (referring to FIG. 4) for example, the semiconductor structure 402 is formed by disposing a plurality of electrical bonding pads 406 on a semiconductor chip 404. For the structure of the fifth embodiment (referring to FIGS. 5(a) and 5(c)) for example, the semiconductor structure 402 further includes a cover layer (not shown) formed on the semiconductor chip 404. The cover layer can be a thermally or electrically conductive layer, e.g., a metal layer. For the structure of the sixth embodiment (referring to FIGS. 6(a) and 6(b)) for example, the semiconductor structure 402 further includes another semiconductor chip (not shown) formed on the semiconductor chip 404 and a bonding layer, wherein the bonding layer is formed between the two semiconductor chips and on both of the semiconductor chips a plurality of electrical bonding pads is respectively formed (not shown).

Figure 15D:
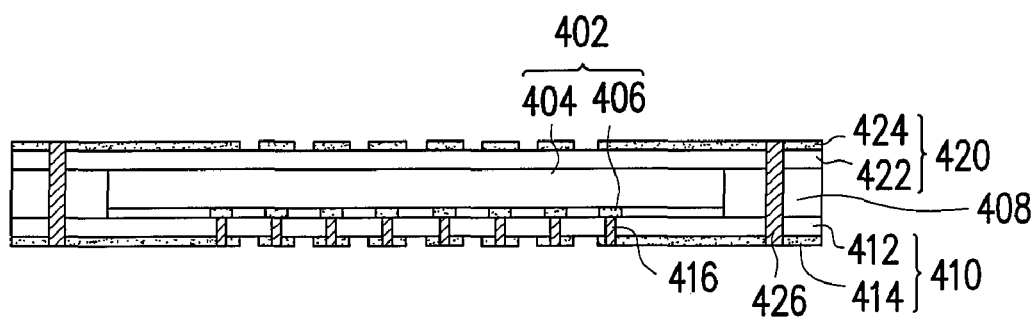
Figure 16A:
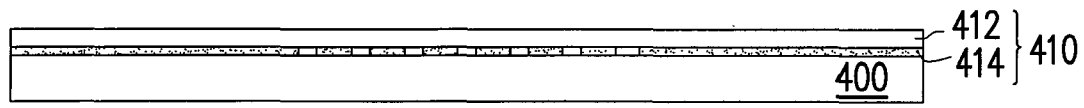
FIGS. 16A-16D are process flow cross-sectional drawings showing another method for fabricating the embedded chip packages according to the embodiments 7-9 of the present invention.
Figure 16B:
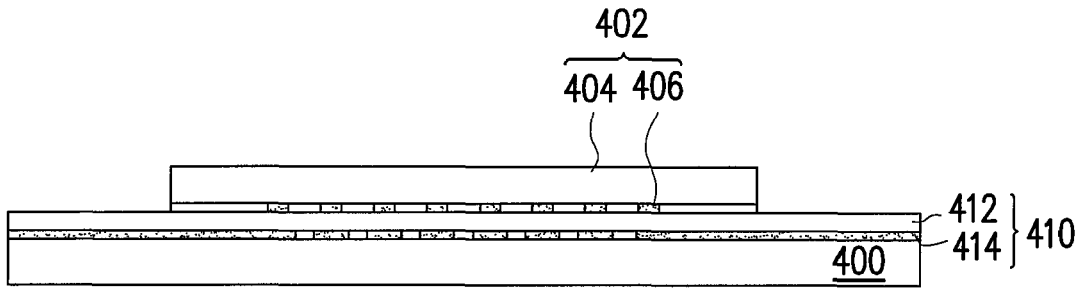
Figure 16C:
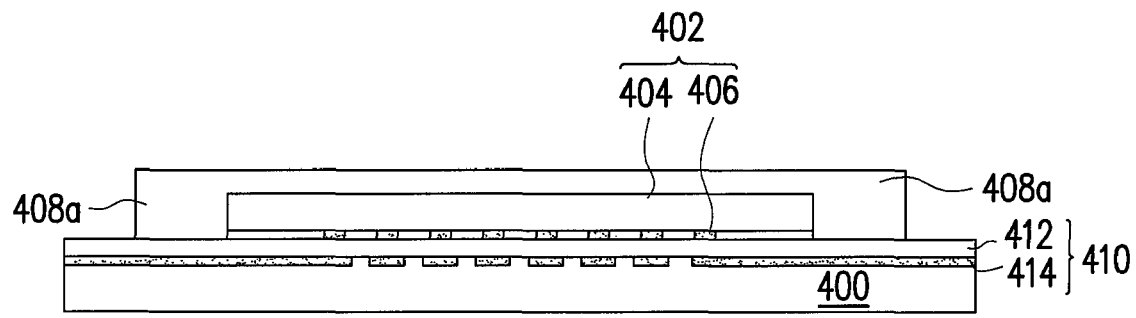
Figure 16D:
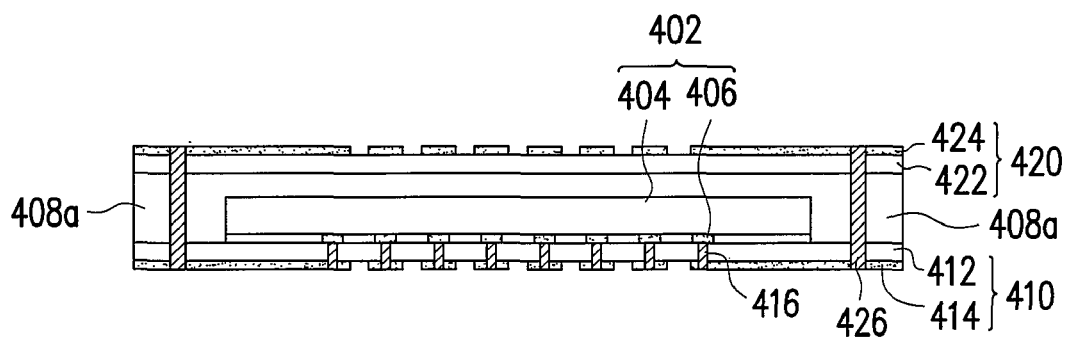

Referring to FIG. 15D next, a substrate 420 is formed on the encapsulating material layer 408 and the semiconductor structure 402. The substrate 410 mainly includes a dielectric layer 422 and a patterned circuit layer 424. After that, the carrier plate 400 is removed, followed by forming a plurality of conductive vias 416 and a plurality of conductive vias 426 to electrically connect the patterned circuit layer 414 to the electrical bonding pads 406 and to electrically connect the patterned circuit layer 414 to the patterned circuit layer 424, respectively. The step of FIG. 15D for the sixth embodiment (referring to FIGS. 6(a) and 6(b)), for example, also includes forming a via hole (not shown) to electrically connect the patterned circuit layer 424 to the semiconductor structure 402. After forming the conductive vias 416 and 426, a portion of the substrate 410 and a portion of the substrate 420 can be furthermore removed and the remained substrates 410 and 420 are cut and trimmed to fit the dimension requirements of different devices.

FIGS. 16A-16D are process flow cross-sectional drawings showing another method for fabricating the embedded chip packages according to the embodiments 7-9 of the present invention.

The steps of FIGS. 16A-16D are similar to the steps shown by FIGS. 15A-15D, except the encapsulating material layer 408a herein is formed around the semiconductor structure 402 and covers the semiconductor structure 402. Similarly, for the structure of the seventh embodiment (referring to FIG. 7) for example, the semiconductor structure 402 is formed by disposing a plurality of electrical bonding pads 406 on a semiconductor chip 404. For the structure of the eighth embodiment (referring to FIGS. 8(a)-8(c)) for example, the semiconductor structure 402 further includes a cover layer (not shown) formed on the semiconductor chip 404. The cover layer can be a thermally or electrically conductive layer, e.g., a metal layer. For the structure of the ninth embodiment (referring to FIGS. 9(a) and 9(b)) for example, the semiconductor structure 402 further includes another semiconductor chip (not shown) formed on the semiconductor chip 404 and a bonding layer, wherein the bonding layer is formed between the two semiconductor chips and on both of the semiconductor chips a plurality of electrical bonding pads is respectively formed (not shown). In addition, the step of FIG. 16D for the sixth embodiment (referring to FIGS. 6(a) and 6(b)), for example, also includes forming a via hole (not shown) to electrically connect the patterned circuit layer 424 to the semiconductor structure 402.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An embedded chip package, comprising:
a first substrate, comprising at least a first dielectric layer and at least a first patterned circuit layer disposed on a bottom surface of the first dielectric layer;
a semiconductor chip, having a first surface and a second surface opposite the first surface, wherein the semiconductor chip disposes on the first substrate;
a plurality of first electrical bonding pads, on the first surface of the semiconductor chip, wherein the first electrical bonding pads contact an upper surface of the first dielectric layer;
an encapsulating material layer, disposed on the first substrate and around the semiconductor chip;
a plurality of first conductive vias, disposed in the first substrate to electrically connect the first patterned circuit layer to the first electrical bonding pads;
a second substrate, comprising at least a second dielectric layer and at least a second patterned circuit layer directly disposed on the second dielectric layer, wherein the second substrate is disposed on the second surface of the semiconductor chip and the encapsulating material layer; and the second dielectric layer contacts the second surface of the semiconductor chip; and
a plurality of second conductive vias, disposed in the first substrate, the encapsulating material layer and the second substrate to electrically connect the first patterned circuit layer to the second patterned circuit layer.

2. The embedded chip package according to claim 1, wherein the material of the encapsulating material layer comprises molding compound or potting/casting compound.

3. The embedded chip package according to claim 1, wherein the encapsulating material layer can be further disposed on the semiconductor chip.

4. An embedded chip package, comprising:
a first substrate, comprising at least a first dielectric layer and at least a first patterned circuit layer disposed on a bottom surface of the first dielectric layer;
a semiconductor chip, having a first surface and a second surface opposite the first surface, wherein the semiconductor chip disposes on the first substrate;
a plurality of first electrical bonding pads, on the first surface of the semiconductor chip, wherein the first electrical bonding pads contact an upper surface of the first dielectric layer;
a cover layer, comprising a front surface and a back surface opposite the front surface, wherein the back surface of the cover layer is directly on the second surface of the semiconductor chip;
an encapsulating material layer, disposed on the first substrate and around the semiconductor chip;
a plurality of first conductive vias, disposed in the first substrate to electrically connect the first patterned circuit layer to the first electrical bonding pads;
a second substrate over the second surface of the semiconductor chip and is disposed on the encapsulating material layer, the second substrate comprises at least a second dielectric layer and at least a second patterned circuit layer disposed on the second dielectric layer, wherein the front surface of the cover layer wholly contacts the second dielectric layer; and a plurality of second conductive vias, disposed in the first substrate, the encapsulating material layer and the second substrate to electrically connect the first patterned circuit layer to the second patterned circuit layer.

5. The embedded chip package according to claim 4, wherein the material of the encapsulating material layer comprises molding compound or potting/casting compound.

6. The embedded chip package according to claim 4, wherein the encapsulating material layer can be further disposed on the semiconductor chip.

7. The embedded chip package according to claim 4, wherein the cover layer can be a thermally or electrically conductive material.

* * * * *